(12) United States Patent
Krieger

(10) Patent No.: US 6,501,664 B1
(45) Date of Patent: Dec. 31, 2002

(54) DECOUPLING STRUCTURE AND METHOD FOR PRINTED CIRCUIT BOARD COMPONENT

(75) Inventor: Jeffrey L. Krieger, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/608,183

(22) Filed: Jun. 30, 2000

(51) Int. Cl.[7] .............................................. H05K 7/06
(52) U.S. Cl. ...................... 361/782; 361/777; 361/780; 257/724; 29/840
(58) Field of Search ........................... 361/306.2, 734, 361/738, 760, 763, 767, 768, 777, 782, 783, 792, 793–795, 780; 257/691, 700, 723, 724, 778; 174/255, 266, 260–264; 29/840

(56) References Cited

U.S. PATENT DOCUMENTS

| | | | |
|---|---|---|---|
| 5,010,447 A | * 4/1991 | Wallace | 361/782 |
| 5,132,613 A | * 7/1992 | Papae et al. | 361/794 |
| 5,786,630 A | * 7/1998 | Bhansali et al. | 257/723 |
| 5,812,380 A | * 9/1998 | Frech et al. | 361/794 |
| 5,825,628 A | * 10/1998 | Garbelli et al. | 361/783 |
| 5,877,942 A | * 3/1999 | Kida et al. | 361/777 |
| 5,941,447 A | * 8/1999 | Chu et al. | 361/782 |
| 6,084,779 A | * 7/2000 | Fang | 361/734 |
| 6,108,210 A | * 8/2000 | Chung | 361/783 |
| 6,166,457 A | * 12/2000 | Iguchi et al. | 361/794 |
| 6,274,214 B1 | * 8/2001 | Chan et al. | 257/724 |
| 6,281,042 B1 | * 8/2001 | Ahn et al. | 257/723 |
| 6,285,558 B1 | * 9/2001 | Frantz et al. | 361/760 |
| 6,297,965 B1 | * 10/2001 | Sasaki et al. | 361/782 |
| 6,310,393 B1 | * 10/2001 | Ogura et al. | 257/723 |
| 6,310,780 B1 | * 10/2001 | Tamura et al. | 361/760 |
| 6,313,998 B1 | * 11/2001 | Kledzik et al. | 361/767 |
| 6,326,699 B2 | * 12/2001 | Shimizu et al. | 257/691 |

* cited by examiner

*Primary Examiner*—David L. Talbott
*Assistant Examiner*—John B. Vigushin
(74) *Attorney, Agent, or Firm*—Antonelli, Terry, Stout & Kraus, LLP

(57) ABSTRACT

A wiring lay-out is provided, for electrically connecting a decoupling cap on a front surface of a multilayer printed circuit board (e.g., a motherboard), with a surface-mounted electrical component (e.g., a micro-ball grid array packaged semiconductor device, such as a PC core logic chip set) on the front surface of the printed circuit board. The wiring lay-out includes a wiring portion formed from a copper plane on the front surface of the printed circuit board; this wiring portion, providing electrical connection from one of the balls of the ball grid array to the decoupling cap, is provided only on the front surface of the printed circuit board. In order to provide a route for the wiring between the electrical component and decoupling cap, vias through the printed circuit board are positioned in a row with bonding pads. All decoupling caps on the printed circuit board are provided on the front surface of the printed circuit board.

27 Claims, 4 Drawing Sheets

DECOUPLING STRUCTURE AND METHOD FOR PRINTED CIRCUIT BOARD COMPONENT

BACKGROUND

The present invention is directed to printed circuit board lay-outs for decoupling electrical components mounted on the printed circuit boards, and methods of fabricating populated printed circuit boards having such lay-outs. The present invention is especially directed to such lay-outs, and such methods, for decoupling micro-ball grid array packaged electrical components (such as micro-ball grid array packaged chip sets) mounted on printed circuit boards, especially on motherboards. In particular, the present invention is directed to such lay-outs, and methods, whereby all decoupling caps (decoupling capacitors) can be provided on the front surface of the printed circuit board, while minimizing loop area of the decoupling circuit. The front surface of the printed circuit board is the surface on which the electrical components are mounted.

Previous lay-outs for decoupling circuits on printed circuit boards, such as motherboards, included designs wherein the decoupling caps populated both the front and rear surfaces of the motherboards. For example, previous lay-outs for decoupling MTH (82805AA), a chip set with a wire-bonded ball grid array package, made by Intel® Corp., required five decoupling caps placed on the backside (rear surface) of the motherboard, in addition to placing eight or nine decoupling caps on the top side (front surface) of the motherboard. Costs associated with placing decoupling caps on the rear surface of the motherboard are higher than those associated with placing decoupling caps on the front surface of the motherboard.

It has been proposed to provide lay-outs for, e.g., a motherboard, wherein all decoupling caps are on the front surface. In one such proposed technique, the circuit wiring between the micro-ball grid array packaged electrical component to be decoupled and the decoupling cap extends along the interior of the motherboard, and the effective current loop area, which directly translates to loop inductance, between the, e.g., micro-ball grid array packaged electrical component and decoupling cap, is disadvantageously large.

BRIEF DESCRIPTION OF THE DRAWINGS

The foregoing and a better understanding of the present invention will become apparent from the following detailed description of example embodiments and claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only, and is not limited thereto. The spirit and scope of the present invention is limited only by the terms of the appended claims.

The following represents brief descriptions of the drawings, wherein.

DETAILED DESCRIPTION

Figure 1:
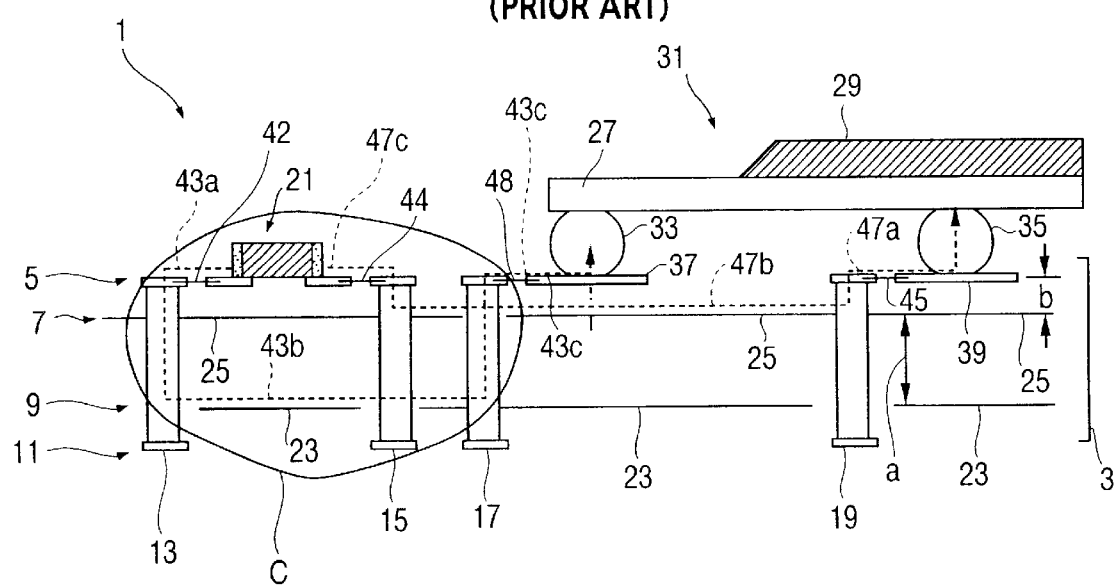
FIG. 1 is a schematic cross-sectional view showing a standard design lay-out forming a circuit between a decoupling cap and a ball grid array packaged electrical device.

In the following descriptions in connection with the drawing figures, the present invention will be described in connection with application to a motherboard having a micro-ball grid array packaged semiconductor device mounted on a front surface of the motherboard, the semiconductor device being in electrical connection with a decoupling cap on the front surface of the motherboard by way of a power (PWR) ball and ground (GND) ball of the ball grid array package, with the ground (GND) ball of the package being electrically connected to the ground pin of the decoupling cap. However, the present invention is not limited to use with such micro-ball grid array packaged component or with motherboards. Generally, the present invention can be used in connection with printed circuit boards, particularly multilayer printed circuit boards. Moreover, example embodiments of the present invention can be used in connection with various electrical components, that attach to a printed circuit board like a ball grid array packaged device is attached thereto. That is, example embodiments of the present invention are applicable to decouple different types of electrical devices surface mounted on printed circuit boards, that are surface mounted to rows of bonding pads on the printed circuit boards, and wherein there is no direct access to interior bonding pads of the rows of bonding pads. The present invention is particularly suited for personal computer core logic chip set components, as the electrical component, having micro-ball grid array packages, surface-mounted on a motherboard.

The present invention provides structure and circuit lay-out wherein all decoupling caps can be provided on the front surface of the motherboard (that is, the side of the motherboard upon which the components to be decoupled are mounted), and which has decreased effective current loop area (which directly translates to reduced loop inductance) between the decoupling caps and the ball grid array packaged component. Using this lay-out technique, the loop inductance is significantly reduced compared to previous decoupling cap and lay-out techniques. In addition, by minimizing or eliminating the need for rear side decoupling caps, assembly rate can be increased. Moreover, fewer caps need be used than in previous designs, which also helps reduce costs.

Example embodiments of the present invention utilize a plane of conductive material (for example, of copper) on the front surface of the motherboard, to provide wiring between (1) desired pads on the printed circuit board attached to, for example, the ground ball of the micro-ball grid array packaged device, and (2) the decoupling cap. That is, wiring between the, e.g., ground ball of the micro-ball grid array packaged device and the decoupling cap extends only on the front surface of the motherboard. Moreover, according to example embodiments of the present invention, vias are provided in rows with bonding pads (for attaching balls of the ball grid array packaged device) on the motherboard, so that open space between the rows can be used to route wiring from a decoupling cap to a bonding pad.

Through use of the plane of conductive metal on the front surface of the motherboard, for the wiring between, for example, a ground (GND) ball attached to a bonding pad and a ground pin of the decoupling cap, the aforementioned effective current loop area between the decoupling cap and the ball grid array packaged component can be substantially minimized. Moreover, all decoupling caps can be easily and effectively provided on the front surface of the motherboard, to avoid increased costs and difficulties in connection with rear surface decoupling caps. Furthermore, routing between bonding pads and decoupling caps can easily and effectively be achieved through use of vias being positioned in rows with the bonding pads, opening up space for wiring between the rows.

Figure 2:
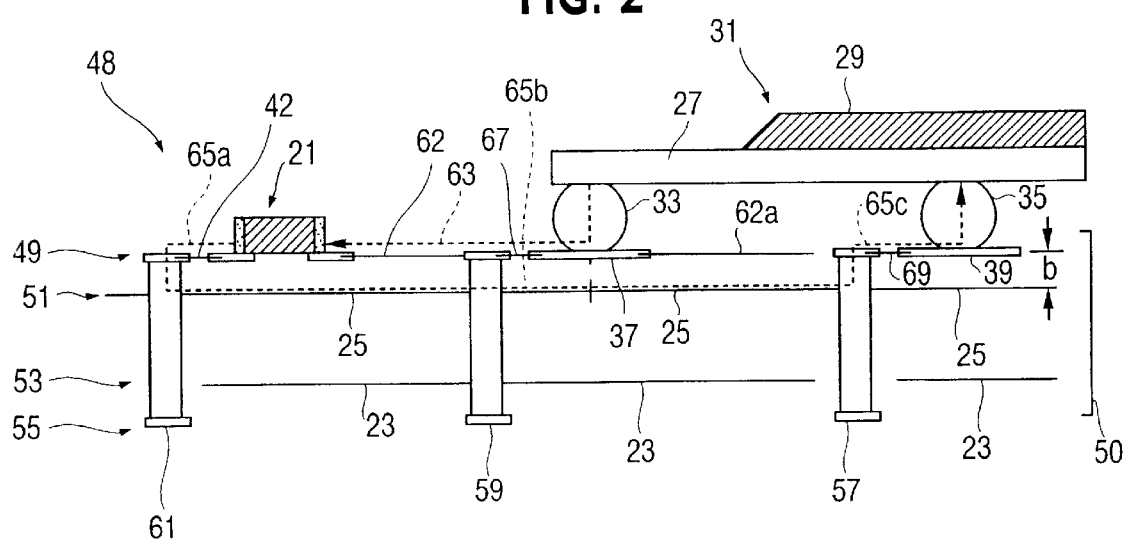
FIG. 2 is a schematic cross-sectional view showing a design lay-out forming a circuit between the decoupling cap and a ball grid array packaged electrical device, according to an example embodiment of the present invention.

Referring to the figures in which like numerals indicate like elements, FIGS. 1 and 2 respectively show a standard lay-out for connection of a micro-ball grid array packaged electrical component on a motherboard to a decoupling cap; and a lay-out, according to an example embodiment of the present invention for connection of a micro-ball grid array packaged electrical component on a motherboard to a decoupling cap. The lay-out of FIG. 2 has the wiring between the bonding pad, connected to the ground (GND) ball, and the decoupling cap extending along the front surface of the motherboard (using a plane of conductive material on the front surface to form such wiring, called a plane under ball grid array (PUB) technique).

In FIGS. 1 and 2, only the wiring layers of a multi-layer motherboard are shown. As can be appreciated, between each of the wiring layers shown are layers of insulating material, the vias extending through the wiring layers and such layers of insulating material.

FIG. 1 is a schematic cross-sectional view showing a standard lay-out of motherboard 1, including wiring between decoupling cap 21 and micro-ball grid array packaged device 31. As can be appreciated, micro-ball grid array packaged device 31 includes, for example, semiconductor device 29 and a micro-ball grid array substrate 27. Micro-ball grid array packaged device 31 is attached to motherboard 1 (providing a populated motherboard) by way of ball grid array balls 33, 35 respectively attached to bonding pads 37, 39. According to an example embodiment of the present invention, micro-ball grid array ball 33 is a Ground (GND) ball, and micro-ball grid array ball 35 is a Power (PWR) ball for supplying power to the micro-ball grid array packaged device 31.

Motherboard 1 in FIG. 1 has first through fourth wiring layers 5, 7, 9 and 11, respectively. First and fourth wiring layers 5 and 11, respectively, are respectively on front and rear surfaces of board member 3 of motherboard 1, while second and third wiring layers 7 and 9, respectively, are internal wiring layers of motherboard 1. In the design lay-out of motherboard 1 in FIG. 1, ground wiring 23 is provided in third wiring layer 9 of the multilayer wiring, and power supply wiring 25 is provided in second wiring layer 7 of the multilayer wiring. Also shown in FIG. 1 are vias 13, 15, 17 and 19, extending through board member 3 in a thickness direction thereof.

The wiring for current flow to decoupling cap 21 will now be described, for a standard lay-out design as in FIG. 1. That is, ground (GND) ball 33 is electrically connected through bonding pad 37, trace 48 connecting pad 37 to via 17, via 17 to third wiring layer 9, through via 13 to first wiring layer 5, and then through trace 42 to decoupling cap 21. This provides a current flow path shown by dotted line in FIG. 1 and designated by reference characters 43a, 43b and 43c. As can be appreciated, according to this standard technique the current flow path from ground (GND) ball 33 to decoupling cap 21 extends down to third wiring layer 9 of motherboard 1.

Current flow path between power (PWR) ball 35 and decoupling cap 21 is by way of trace 45 connecting bonding pad 37 to via 19, through via 19 to second wiring layer 7 and along second layer wiring 7 to via 15, up to first wiring layer 5 through via 15, and then by way of trace 44 from via 15 to decoupling cap 21. This provides a current flow path shown by dotted line in FIG. 1 and designated by reference characters 47a, 47b and 47c.

As can be appreciated from FIG. 1, according to standard techniques current flow from ground (GND) ball 33 to decoupling cap 21 extends along third wiring layer 9, deep in board member 3 of motherboard 1. With, for example, the distance between second and third wiring layers 7 and 9 (designated by "a" in FIG. 1) being 48 mils nominal and the distance between first and second wiring layers 5 and 7 (shown by reference character "b" in FIG. 1) being 4.5 mils nominal, the separation between current flows in the standard structure, within "c" shown in FIG. 1, is 48–53 mils. Such large separation produces disadvantageously large loop inductance.

The lay-out design of FIG. 2, which is an example embodiment of the present invention, provides reduced separation in the current flow between ball grid array packaged device 31 and decoupling cap 21, and will be described in the following. In particular, such reduced separation is accomplished by providing current flow between decoupling cap 21 and ground (GND) ball 33 only along first wiring layer 49 on the surface of board member 50 of motherboard 48. This is achieved, according to example embodiments of the present invention, through use of planar conducting material layer 62 extending on (along) the surface of board member 50, and extending under ball grid array substrate 27 (the portion of material layer 62 extending under ball grid array substrate 27 being designated by reference character 62a).

In the lay-out design of FIG. 2, according to an example embodiment of the present invention, shown are vias 57, 59 and 61, and first through fourth wiring layers respectively designated by reference characters 49, 51, 53 and 55. In motherboard 48, wiring layers 49, 51, 53 and 55 are separated from each other in the thickness direction of board member 50 by insulating layers, as known in the art. Second wiring layer 51 and third wiring layer 53 are each internal wiring layers of motherboard 48, and first wiring layer 49 and fourth wiring layer 55 respectively are on front and rear surfaces of board member 50. Motherboard 48, and motherboard 1 of FIG. 1, are each multi-layer (that is, 4-layer) wiring boards. In the lay-out design of FIG. 2, second wiring layer 51 forms wiring 25 for supplying power to ball grid array ball 35 through pad 39, and third wiring layer 53 provides ground (GND) wiring 23, which is electrically connected to ground (GND) ball 33 through pad 37.

Current flow according to an example embodiment of the present invention, shown in FIG. 2, is as follows. Current flows between ground (GND) ball 33 and decoupling cap 21 by way of pad 37, trace 67 connecting pad 37 to via 59, and planar conductive material layer 62 (the current flow path being the dotted line represented by reference character 63 in FIG. 2, between ground (GND) ball 33 and decoupling cap 21). As can be appreciated, the flow path is only on the front surface of board member 50.

Flow path between power (PWR) ball 35 and decoupling cap 21 is by way of bonding pad 39, trace 69 connecting pad 39 and via 57, by via 57 to second wiring layer 51 and along second wiring layer 51, to via 61, by way of via 61 to first wiring layer 49 and to decoupling cap 21 through trace 92. This current flow path between power (PWR) ball 35 and decoupling cap 21 is shown by the dotted line represented by reference characters 65a, 65b and 65c.

As seen in FIG. 2, according to an example embodiment of the present invention shown therein, separation between current flows is only the distance represented by reference character "b", between first wiring layer 49 and second wiring layer 51. Illustratively, this distance "b" is 4.5 mils nominal. Thus, as can be seen in comparing FIGS. 1 and 2, the separation between current flows is much less according to an example embodiment of the present invention than through standard lay-out designs with the decoupling cap on the front surface.

Figure 3:
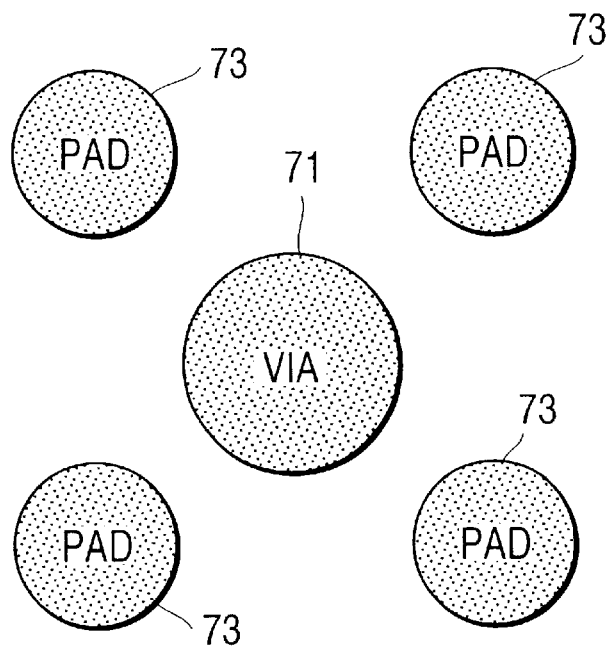
FIG. 3 is an illustration for explaining placement of vias and bonding pads according to conventional structure.
Figure 4:
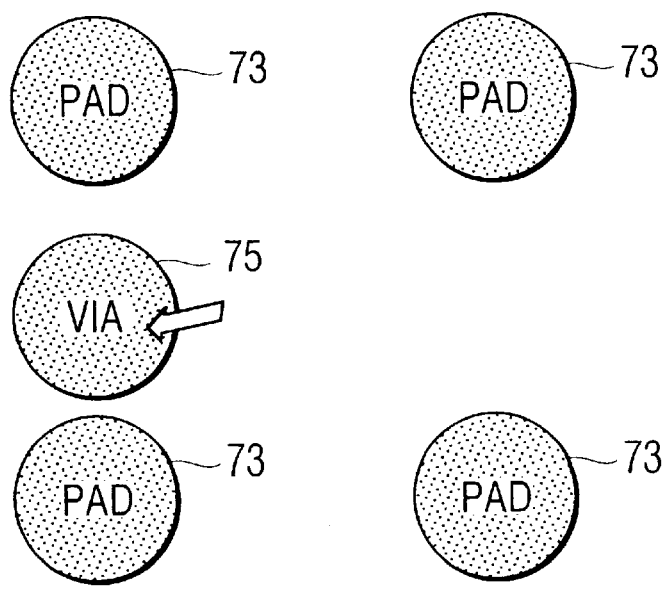
FIG. 4 is an illustration for explaining placement of vias and bonding pads according to an example embodiment of the present invention.

Aspects of the present invention are also achieved by moving vias extending through the motherboard, to a position in line with pads for attaching the electrical component to the motherboard. This frees a route for passage of wiring between the decoupling cap and micro-ball grid array packaged component, to achieve the circuit design according to the present invention. Such moving of the via pad is shown illustratively in comparing FIGS. 3 and 4. FIG. 3 shows the conventional via placement. That is, via 71 is positioned among pads 73, 73, 73 and 73, between rows of pads 73. According to the design utilized in example embodiments of the present invention, and seen in FIG. 4, via 75 is placed in a row with pads 73, 73, freeing a route between the two rows of pads and vias, for wiring. Moreover, as seen in FIG. 4, via 75 is smaller in size than via 71 of conventional design lay-out, vias 75 being of substantially a same size, in plan view, as pad 73.

Figure 5:
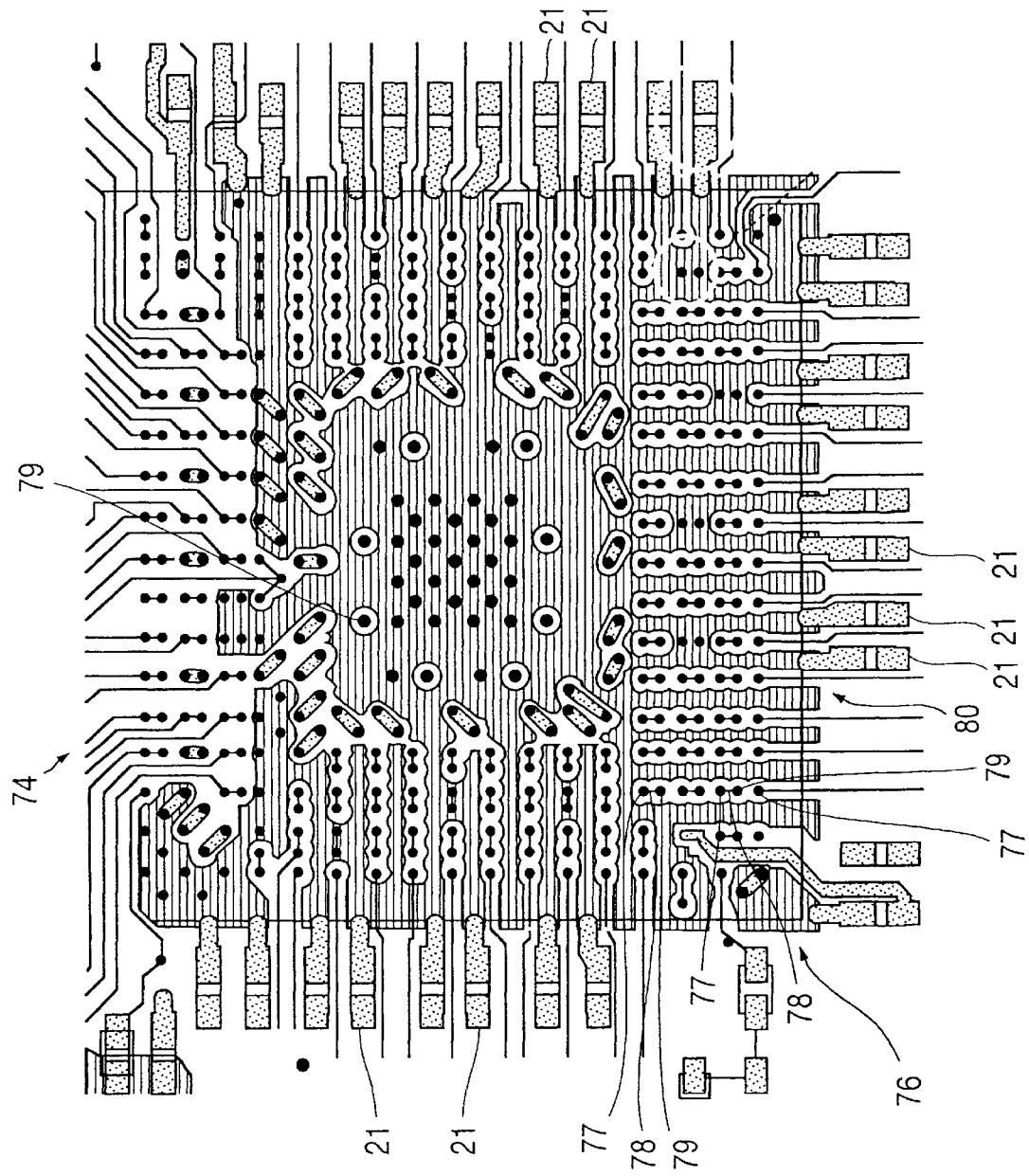
FIG. 5 is a plan view of the front surface of a printed circuit board according to an example embodiment of the present invention.

Effectiveness of this positioning of via 75 in a row with pad 73 can be seen in FIG. 5, which is a plan view of the front surface of motherboard 74, without the ball grid array packaged component attached thereto. Shown in FIG. 5 is copper plane 76, which is the plane of conductive material from which wiring between ground (GND) ball 33 and decoupling cap 21 is made, and which extends under the ball grid array packaged component as discussed previously. Also shown in FIG. 5 are decoupling caps 21, around three sides of the location for attaching the ball grid array component to motherboard 74. Also illustrated in FIG. 5 are bonding pads 77 and vias 79. As can be appreciated, the bonding pads and vias are in a row, leaving spacing 80 between the rows containing vias 79 and pads 77. Moving of vias 79 to be in a row with pads 77 frees up spacing 80, so that an effective lay-out technique for example embodiments of the present invention of, for example, having wirings between the component and decoupling cap along the front surface of motherboard 74, can be achieved. As seen in FIG. 5, tracings 78 are provided for electrically connecting pad 77 with via 79 associated therewith.

The printed circuit board (for example, motherboard) according to the present invention can be fabricated by conventional techniques of fabricating multi-layer printed circuit boards, including multi-layer motherboards.

As indicated previously, the example embodiments of the present invention are particularly applicable in attaching ball grid array packaged electrical components (for example, micro-ball grid array electrical components) to motherboards. Thus, according to this example embodiment of the present invention, balls of the ball grid array packaged electrical component are attached to bonding pads of the motherboard. For example, a power (PWR) ball of a micro-ball grid array packaged electrical component is attached to a bonding pad electrically connected to power wiring of the motherboard, and, for example, a ground (GND) ball of the micro-ball grid array is attached to a bonding pad electrically connected to ground wiring of the motherboard. Illustratively, turning to FIG. 2, attaching ball 35 to bonding pad 39 provides electrical connection to power wiring 25 of second wiring layer 51 of multi-layer wiring of motherboard 48. Moreover, attaching ground (GND) ball 33 to pad 37 provides electrical connection to ground wiring 23 of third wiring layer 53.

Figure 6:
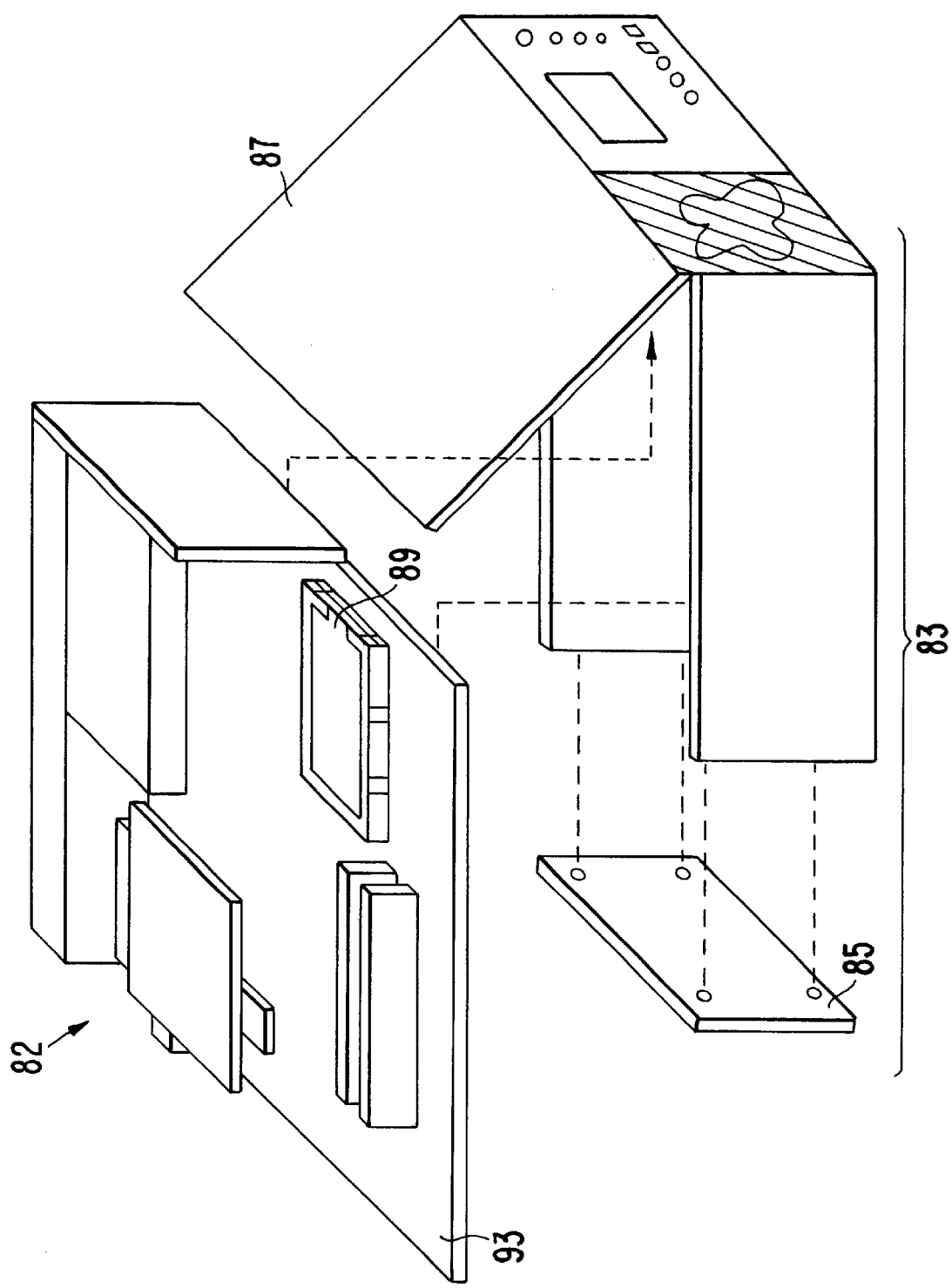
FIG. 6 schematically shows a computer system to which an example embodiment of the present invention can be applied.

The present invention can effectively be utilized in providing a motherboard of a computer system. Shown in FIG. 6 is computer system 82, having chassis 83 with back panel 85 and hinged top cover 87. Schematically shown in FIG. 6 is motherboard 93, having, for example, micro-ball grid array packaged electrical component 89 thereon. The lay-out design of motherboard 93, for the attachment of micro-ball grid array packaged component 89 thereto, and to connect component 89 to decoupling caps on the front surface of motherboard 93 (the decoupling caps not being shown in FIG. 6) can utilize wiring structures as seen in, for example, FIGS. 2 and 5, with vias and bonding pads provided in rows as seen in FIG. 4, to achieve the advantages according to example embodiments of the present invention.

Accordingly, through various example embodiments of the present invention, reduced effective current loop area (which directly translates to reduced loop inductance) between the decoupling caps and the ball grid array packaged component can be reduced. The more that the loop inductance between the ball grid array packaged component and decoupling caps can be minimized, the more effective the decoupling caps are at maintaining clean power delivery to the ball grid array packaged component. Thus, the present invention provides improved power delivery over previous techniques.

Many different embodiments of the present invention may be constructed without departing from the spirit and scope of the present invention. Thus, the lay-out design according to example embodiments of the present invention can be applied to various printed circuit boards, for various uses, including uses in computers or in other applications. Moreover, various components other than micro-ball grid array components can be attached to the printed wiring board using example embodiments of the present invention. Components that attach to printed circuit boards by techniques corresponding to ball grid array attachments (that is, surface mounting on the front surface of the printed circuit board, with multiple bonding pads in a row such that there is difficulty in direct access to inside pads), can utilize example embodiments of the present invention. It should be understood that the present invention is not limited to the specific embodiments described in this specification. To the contrary, the present invention is intended to cover various modifications and equivalent arrangements included within the spirit and scope of the claims.

What is claimed is:

1. Printed circuit board comprising:
   a board member having a front surface;
   bonding pads, for at least one electrical component, exposed at said front surface;
   at least one decoupling cap on said front surface; and wiring provided between (a) bonding pads for a respective electrical component, of said at least one electrical component, and (b) one of said at least one decoupling cap, wherein said wiring includes a first wiring portion, electrically connecting a bonding pad, of said bonding pads, to said decoupling cap, said first wiring portion extending only in a first layer on the front surface of the board member, wherein said board member has a rear surface, spaced from the front surface in a thickness direction of the board member, and wherein said wiring includes a second wiring portion extending in a second layer between the front and rear surfaces of the board member.

2. Printed circuit board according to claim 1, wherein all decoupling caps on the printed circuit board are on the front surface of the board member.

3. Printed circuit board according to claim 1, wherein the printed circuit board further comprises vias extending through the board member, and wherein the vias are arranged in rows with the bonding pads.

4. Printed circuit board according to claim 3, wherein each via, in plan view, is of substantially a same size as each bonding pad, in plan view.

5. Method of fabricating a populated printed circuit board, comprising:

providing a printed circuit board according to claim 1; and attaching said respective electrical component to said printed circuit board, wherein said respective electrical component is a micro-ball grid array packaged electrical component, and wherein said attaching is performed by attaching balls of said micro-ball grid array packaged electrical component respectively to said bonding pads.

6. Method of fabricating a populated printed circuit board according to claim 5, wherein said balls attached to said bonding pads include a ground (GND) ball and a power (PWR) ball, and wherein said bonding pads to which the ground (GND) ball and power (PWR) ball are respectively attached are respectively electrically connected to said first wiring portion and said second wiring portion.

7. Populated printed circuit board, comprising:

a board member having a front surface;

bonding pads exposed at said front surface;

an electrical component attached to said bonding pads, wherein said electrical component is a ball grid array packaged electrical component;

a decoupling cap on said front surface;

a plane of conductive material provided on the front surface, said plane of conductive material forming a first wiring portion electrically connecting a bonding pad, attached to the electrical component, to the decoupling cap; and a second wiring portion electrically connecting another bonding pad, of the bonding pads attached to the electrical component, to the decoupling cap.

8. Populated printed circuit board according to claim 7, wherein the first wiring portion electrically connects a bonding pad, attached to a ground (GND) ball of the ball grid array packaged electrical component, to the decoupling cap, and the second wiring portion electrically connects a bonding pad, attached to a power (PWR) ball of the ball grid array packaged electrical component, to the decoupling cap.

9. Populated printed circuit board according to claim 8, wherein the board member has a rear surface spaced from the front surface in a thickness direction of the board member, and wherein the second wiring portion extends within the board member in a second layer between the front and rear surfaces.

10. Populated printed circuit board according to claim 7, wherein said plane of conductive material extends beneath the electrical component, between the front surface and the electrical component.

11. Populated printed circuit board according to claim 10, further comprising vias extending through the board member, and wherein the vias are arranged in rows with the bonding pads.

12. Computer system comprising:

a computer chassis; and the populated printed circuit board according to claim 6, within the computer chassis.

13. Populated printed circuit board, comprising:

a board member having a front surface;

bonding pads exposed at said front surface;

an electrical component attached to said bonding pads;

a decoupling cap on said front surface; and wiring provided to electrically connect bonding pads, attached to said electrical component, to said decoupling cap, wherein said wiring includes a first wiring portion, electrically connecting a bonding pad, of said bonding pads, to said decoupling cap, the first wiring portion extending only in a first layer on the front surface of the board member, and wherein said board member has a rear surface, spaced from the front surface in a thickness direction of the board member, and wherein said wiring further includes a second wiring portion extending in a second layer between the front and rear surfaces of the board member.

14. Populated printed circuit board according to claim 13, wherein said printed circuit board has at least four layers of wiring, respectively spaced from each other in the thickness direction of the board member, said at least four layers including the first and second layers, and wherein said second layer, in which said second wiring portion extends, is between said first layer, on the surface of the board member, and a third layer of the at least four layers, the third layer being between the second layer and a fourth layer of the at least four layers, the fourth layer being on the rear surface of the board member.

15. Populated printed circuit board according to claim 14, wherein said electrical component is a micro-ball grid array electrical component.

16. Populated printed circuit board according to claim 15, wherein said micro-ball grid array component is a micro-ball grid array chip set.

17. Populated printed circuit board according to claim 14, further comprising vias extending in the thickness direction of the board member, through the board member, wherein the printed circuit board includes a plurality of said bonding pads and a plurality of said vias, with the bonding pads and vias positioned in rows, each row including both bonding pads and vias.

18. Motherboard comprising:

a board member having a front surface and a rear surface, spaced from each other in a thickness direction of the board member;

bonding pads exposed at said front surface;

an electrical component connected to said bonding pads, and provided on said front surface;

at least one decoupling cap on said front surface; and wiring provided between said bonding pads and a decoupling cap, of the at least one decoupling cap, wherein said wiring includes a first wiring portion, electrically connecting a bonding pad, of said bonding pads, to said decoupling cap, said first wiring portion extending only in a first layer on the front surface of the board member, and a second wiring portion extending in a second layer between the front and rear surfaces of the board member.

19. Motherboard according to claim 18, wherein said electrical component is a micro-ball grid array packaged electrical component.

20. Motherboard according to claim 19, wherein said micro-ball grid array packaged electrical component is a personal computer core logic chip set.

21. Motherboard according to claim 19, wherein the motherboard further comprises vias extending through the board member in the thickness direction, and wherein the vias are arranged in rows with the bonding pads.

22. Motherboard according to claim 21, having four layers of wiring, respectively spaced from each other in the thickness direction of the board member, said four layers of wiring including the first and second layers, and wherein said second layer, in which said second wiring portion extends, is between said first layer, on the surface of the board member, and a third layer of the four layers, the third layer being between the second layer and a fourth layer of the four layers, the fourth layer being on the rear surface of the board member.

23. Motherboard according to claim 19, wherein the first wiring portion provides electrical connection between (a) a bonding pad electrically connected to a ground (GND) ball of the electrical component and (b) said one of said at least one decoupling cap; and the second wiring portion provides electrical connection between (c) said one of said at least one decoupling cap and (d) a bonding pad electrically connected to a power (PWR) ball of the electrical component.

24. Motherboard according to claim 18, wherein the motherboard has a plurality of decoupling caps, and wherein all decoupling caps of the motherboard are on the front surface of the board member.

25. Motherboard according to claim 18, wherein said first layer is provided in a first plane of conductive material which includes a portion extending under the electrical component, between the electrical component and the front surface of the board member.

26. Computer system, comprising:

a computer chassis; and the motherboard according to claim 19, within the computer chassis.

27. Printed circuit board comprising:

a board member having a front surface;

bonding pads, for at least one electrical component, exposed at said front surface;

at least one decoupling cap on said front surface; and wiring provided between (a) bonding pads for a respective electrical component, of said at least one electrical component, and (b) one of said at least one decoupling cap, wherein said wiring includes a first wiring portion, electrically connecting a bonding pad, of said bonding pads, to said decoupling cap, said first wiring portion extending only in a first layer on the front surface of the board member, wherein the printed circuit board further comprises vias extending through the board member, with the vias being arranged in rows with the bonding pads, and wherein each via, in plan view, is substantially a same size as each bonding pad, in plan view.

* * * * *